US008535999B2

(12) United States Patent
Adam et al.

(10) Patent No.: US 8,535,999 B2
(45) Date of Patent: Sep. 17, 2013

(54) STRESS MEMORIZATION PROCESS IMPROVEMENT FOR IMPROVED TECHNOLOGY PERFORMANCE

(75) Inventors: Lahir Adam, Yorktown Heights, NY (US); Bruce B. Doris, Brewster, NY (US); Sanjay Mehta, Albany, NY (US); Zhengmao Zhu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 12/902,624

(22) Filed: Oct. 12, 2010

(65) Prior Publication Data

US 2012/0086071 A1    Apr. 12, 2012

(51) Int. Cl.
*H01L 21/02*    (2006.01)

(52) U.S. Cl.
USPC ........... 438/199; 438/279; 438/299; 438/303; 438/305; 257/E21.472; 257/E21.632; 257/E21.635; 257/E29.345

(58) Field of Classification Search
USPC ................. 438/197–199, 299–308, 761, 783; 257/E21.473, 632–635, 29.345
See application file for complete search history.

(56) References Cited

U.S. PATENT DOCUMENTS

| 6,566,253 | B2 | 5/2003 | Jiang | |
|---|---|---|---|---|
| 7,592,270 | B2 * | 9/2009 | Teo et al. | 438/778 |
| 8,076,209 | B2 * | 12/2011 | Yang et al. | 438/299 |
| 8,207,043 | B2 * | 6/2012 | Lin et al. | 438/308 |
| 2007/0105299 | A1 | 5/2007 | Fang et al. | |
| 2007/0141775 | A1 | 6/2007 | Teo et al. | |
| 2007/0200179 | A1 | 8/2007 | Chen | |
| 2008/0003734 | A1 | 1/2008 | Chuang et al. | |
| 2008/0036006 | A1 | 2/2008 | Ueno et al. | |
| 2008/0142855 | A1 * | 6/2008 | Ikeda et al. | 257/288 |
| 2009/0280629 | A1 * | 11/2009 | Tan et al. | 438/514 |
| 2009/0286365 | A1 * | 11/2009 | Teo et al. | 438/197 |
| 2009/0289284 | A1 * | 11/2009 | Goh et al. | 257/288 |
| 2009/0298297 | A1 * | 12/2009 | Kanarsky et al. | 438/761 |
| 2011/0006373 | A1 * | 1/2011 | Eller et al. | 257/369 |
| 2011/0147854 | A1 * | 6/2011 | Nandakumar et al. | 257/382 |
| 2011/0163357 | A1 * | 7/2011 | Tan et al. | 257/288 |
| 2012/0108021 | A1 * | 5/2012 | Mehrotra | 438/231 |
| 2012/0129308 | A1 * | 5/2012 | Hoentschel et al. | 438/285 |
| 2012/0196422 | A1 * | 8/2012 | Flachowsky et al. | 438/305 |

OTHER PUBLICATIONS

Chien-Hao, et al., *Stress memorization technique (SMT) by selectively strainted-nitride capping for sub-65nm high-performance strained-Si device application*, 2004 Symposium on VLSI Technology, Digest of Technical Papers, Jun. 15-17, 2004.
Boeuf et al., *Stress memorization technique (SMT) optimization for 45nm CMOS*, IEEE, Conference: 2006 Symposium on VLSI Technology, Jun. 13-15, 2006.
Author(s) disclosed anonymously, *All-In-One Integration for High Performance MOSEFET Devices*, Jun. 29, 2007.

* cited by examiner

*Primary Examiner* — Michael Lebentritt
(74) *Attorney, Agent, or Firm* — Novak Druce Connolly Bove + Quigg LLP; Louis J. Percello, Esq.

(57) ABSTRACT

Semiconductor substrate with a deformed gate region and a method for the fabrication thereof. The semiconductor substrate has improved device performance compared to devices without a deformed gate region and decreased dopant loss compared to devices with deformed source/drain regions.

16 Claims, 3 Drawing Sheets

STRESS MEMORIZATION PROCESS IMPROVEMENT FOR IMPROVED TECHNOLOGY PERFORMANCE

FIELD OF THE DISCLOSURE

The present disclosure relates to semiconductor substrates having a deformed gate region and a method of fabricating the same. More particularly, the present disclosure relates to n-type metal-oxide-semiconductor (NMOS) and p-type metal-oxide-semiconductor (PMOS) devices having improved device performance.

BACKGROUND

Ongoing efforts are being made to enhance carrier mobility in semiconductor devices to increase performance and/or reduce power consumption. The forming of stressed silicon channels by deforming the source/drain region is a known practice. Stress, sometimes referred to as strain, can enhance electron and hole mobility. The performance of a metal-oxide-semiconductor (MOS) device can be enhanced through a stressed-surface channel.

Typically, it is preferred for NMOS devices to have tensile stresses in their channel regions. It is also possible for NMOS devices to benefit from compressive stress in out of plane direction perpendicular to the channel region. PMOS devices benefit from either having compressive stresses in their channel regions and/or from tensile stress in out of plane direction perpendicular to the channel region. Stresses in channel regions can be applied by forming stressed source/drain regions, stressed gate electrodes, stressed contact etch stop layers, etc. One of the methods for applying a beneficial stress to a gate electrode of an NMOS device is to form a stress memorization layer, wherein a typical formation process includes blanket forming a stress memorization layer having an inherent stress, performing an annealing, and then removing the stress memorization layer. The beneficial stress, which is a tensile stress in the channel region and/or a compressive stress in an out-of-plane direction perpendicular to the channel region, is thus "memorized" by the source/drain regions and is imparted onto the channel region of the NMOS device or PMOS device.

SUMMARY OF THE DISCLOSURE

Described herein is a method of fabricating a semiconductor structure which comprises providing a semiconductor substrate; forming a gate structure on the semiconductor substrate; forming a source-drain implant region adjacent to the gate structure; forming a stress-transmitting dielectric layer on the source-drain implant region and the gate structure; removing the stress-transmitting dielectric layer; and performing an annealing step after the removing of the stress-transmitting dielectric layer.

Further described is a semiconductor structure, which comprises a semiconductor substrate; a gate structure on the semiconductor substrate; and a source-drain implant region adjacent to the gate structure; wherein the gate structure is deformed.

BRIEF DESCRIPTION OF THE DRAWINGS

The foregoing and other objects, aspects and advantages will be better understood from the following detailed description of the best and various embodiments with reference to the drawings, in which.

DESCRIPTION OF THE BEST AND VARIOUS EMBODIMENTS

Figure 1:
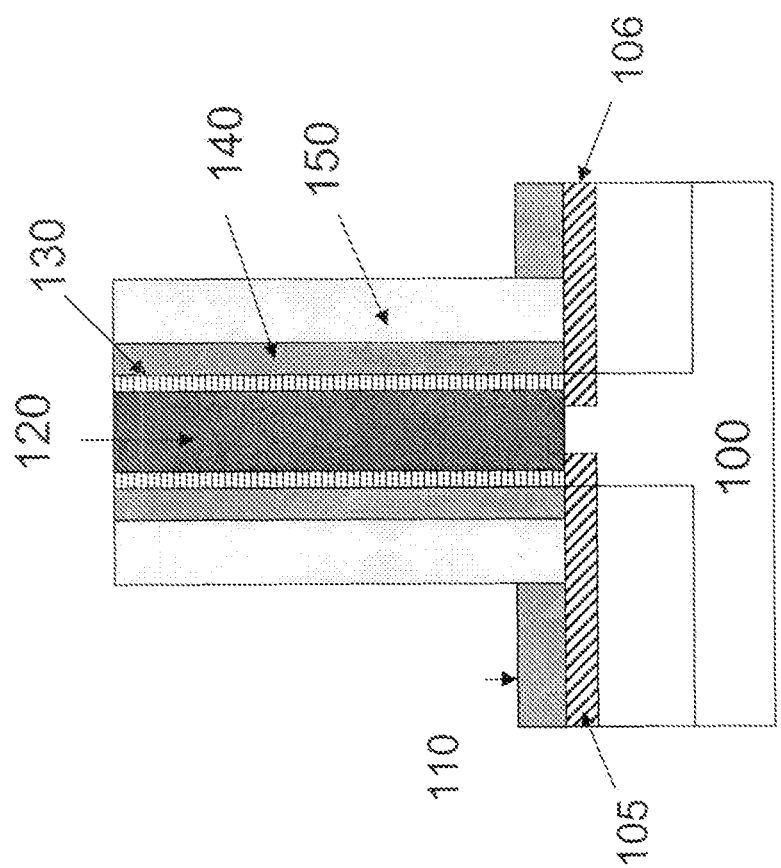
FIG. 1 shows a NMOS device including a substrate 100, a doped source region 105, a doped drain region 106, a source/drain capping oxide layer 110, a polycrystalline gate material 120, a gate spacer 130, an extension spacer 140, and a source/drain spacer 150.

Turning to the drawings, FIG. 1 shows an early processing step in the formation of a NMOS device of a substrate 100 having an oxide-containing capping layer 110. The NMOS device is typically formed by a lithographic process. Also typically, the substrate of FIG. 1a is silicon. The disclosure herein is exemplified for a NMOS device, but the method is also applicable to PMOS devices.

In another aspect of the disclosure, stress memorization technique is applied to field effect transistors (FET's), including n-channel FET (nFET) and p-channel FET (pFET).

Substrate 100 preferably comprises bulk silicon, although other commonly used structures and materials such as silicon on insulator (SOD can be used. Substrate 100 is preferably lightly doped.

Figure 2:
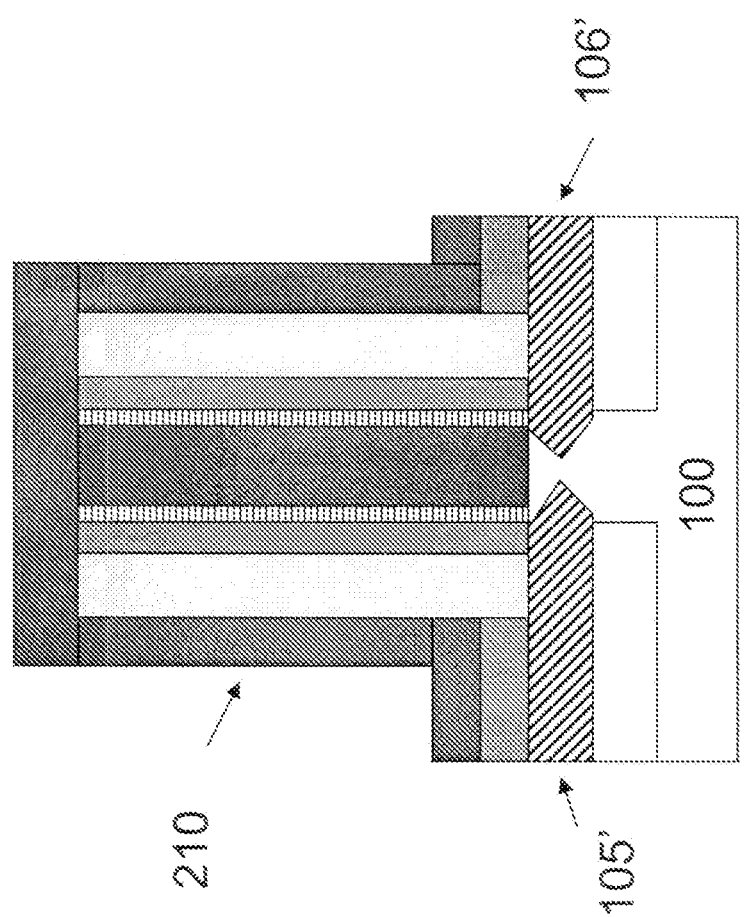
FIG. 2 shows a stress memorization technique (SMT) layer 210 being applied onto the NMOS device.

FIG. 2 depicts the formation of the SMT layer 210 onto the NMOS device. The SMT layer causes beneficial stress to the gate material 120. In particular, gate material 120 is plastically deformed and exerts a beneficial stress onto the underlying channel region located between source/drain regions 105 and 106. The deformation of the channel region caused by the beneficial stress is illustrated by a change in shape of source/drain regions 105 and 106 to the shapes 105' and 106' depicted in FIG. 2. Gate material 120 retains its deformation, in whole or in part, after removal of the SMT layer and the subsequent annealing step.

Figure 3:
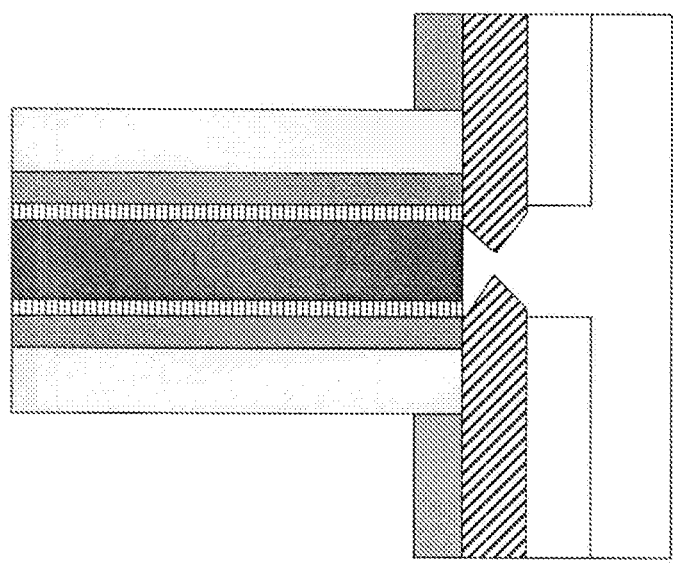
FIG. 3 shows the NMOS device after the removal of the SMT layer and prior to the activation anneal of the source/drain region.

FIG. 3 depicts the NMOS device after the removal of the SMT layer. The gate material maintains some of the deformation caused by the SMT layer, which acts upon the channel region. The NMOS device is then subjected to an annealing treatment to electrically activate the dopants in the source/drain regions.

With particularity, the stress-transmitting dielectric layer is a compressive stress-transmitting dielectric layer. Also with particularity, the stress-transmitting dielectric layer is a tensile stress-transmitting dielectric layer.

In a particular embodiment, stress is transferred by transferring a uniaxial compressive or tensile stress from the stress-transmitting dielectric layer to the gate structure. The uniaxial compressive or tensile stress in the gate structure is, with particularity, of from about 300 MPa to about 3 GPa.

In a particular embodiment, the annealing step is effected at a temperature of from about 950° C. to about 1,200° C.

With particularity, the stress-transmitting dielectric layer is a refractory metal nitride. Further, the refractory metal nitride is selected from the group consisting of TaN, TiN. WN, MoN, NbN, ReN, and a combination thereof. In a particular embodiment, the refractory metal nitride is TiN.

In a particular embodiment, a carrier concentration is substantially unchanged, before and after the annealing step. Further, the carrier is selected, with particularity, from the group consisting of a hole $h^+$ and an electron $e^-$.

In another particular embodiment, a capping layer is applied onto the source-drain implant region prior to the forming of the stress-transmitting dielectric layer.

With particularity, the stress-transmitting dielectric layer is a silicon oxide.

The stress-transmitting dielectric layer exerts, with particularity, a pressure of from about 300 MPa to about 3 GPa.

In another particular embodiment, the deformed gate structure is compressed in a direction perpendicular to the semiconductor substrate. In yet another particular embodiment, the deformed gate structure is elongated in a direction perpendicular to the semiconductor substrate.

With particularity, a shallow trench isolation is provided between the source-drain implant region and the gate structure.

In a particular embodiment, the gate structure is deformed by a compressive stress of from about 5 GPa to about 20 GPa. With particularity, the gate structure is deformed by a compressive stress of from about 300 MPa to about 3 GPa.

In a particular embodiment, a n-type metal-oxide semiconductor (NMOS) or a p-type metal-oxide semiconductor (PMOS) comprises a deformed gate structure.

It has been observed that device performance may be impaired by boron penetration into gate dielectrics, which may result in high leakage currents and degradation of the performance of the respective MOS devices. Boron penetration also affects the gate oxide integrity. The adverse effects are amplified in the related art by the presence of the SMT layer in the annealing step into which boron may diffuse. It is a particular advantage of the instant disclosure that boron diffusion is minimized because the SMT layer is removed prior to the annealing step.

The intermediate stages of manufacturing preferred embodiments of the present disclosure, which reduces the above-discussed adverse effects, are illustrated. Throughout the various views and illustrative embodiments of the present invention, like reference numbers are used to designate like elements.

As depicted in FIG. 1, a gate region 120 is provided on a device. Gate region 120 may include polysilicon, metals, metal silicides, metal nitrides, and other commonly used materials. With particularity, gate region 120 includes polysilicon.

FIG. 1 illustrates the doping with p-type impurities into drain region 106. p-type impurities, such as boron, indium, and the like are introduced into region 106. Typical dosage is between about $1E15/cm^2$ and about $5E15/cm^2$. n-type pre-doping is performed to source region 105 in separate steps. One skilled in the art will realize the corresponding process steps.

Referring to FIG. 1, gate spacer 130 is formed by forming one or more spacer layers (not shown), and then etching the spacer layer(s). In the preferred embodiment, the spacer layer includes a nitride layer on a liner oxide layer. The preferred spacer deposition methods include PECVD, LPCVD, sub-atmospheric chemical vapor deposition (SACVD), and the like.

Referring to FIG. 2, a stress memorization layer 210 is blanket formed. In one embodiment, stress memorization layer 210 has a composite structure including, for example, an upper layer on a lower layer (not shown). In an exemplary embodiment, the upper layer comprises silicon nitride, while the lower layer comprises an oxide. In the embodiment shown in FIG. 2, stress memorization layer 210 includes a single layer, which may be formed of nitrides, oxynitrides, tetra ethyl ortho silicate (TEOS), and other materials with internal stresses. The single layered stress memorization layer 210 particularly has a tensile stress. With particularity, stress memorization layer 210 comprises a nitride.

Also with particularity, the method for forming stress memorization layer 210 includes low-pressure chemical vapor deposition (LPCVD). However, other methods such as plasma enhanced chemical vapor deposition may also be used. The formation temperature is preferably lower than about 800° C.

In FIG. 3, stress memorization layer 210 is removed. Subsequently, the device is annealed. For example, an RTA is performed with a temperature of between about 900° C. and about 1090° C. Other common annealing methods, such as flashing annealing, furnace annealing, laser annealing, and the like, can also be used. During and subsequent to the annealing, transferred stress is memorized by the gate region and continued to be applied to the channel regions.

According to the instant disclosure, the SMT layer is removed prior to the annealing step. Nonetheless, it is also possible to perform the annealing step with the stress memorization layer in place. In the latter case, the stress memorization layer is then removed after the annealing. However, removing the SMT layer prior to annealing helps retaining the dopant in the active region of the device, as illustrated in the Table below.

The following Table illustrates the improved retention of the dopant in the channel region.

TABLE 1

|  | 11B in Si | 11 B in SMT | Total |
| --- | --- | --- | --- |
| Example 1 | 4.24E+13 | n/a | 4.24E+13 |
| Comparative example | 3.38E+13 | 1.47E+13 | 4.85E+13 |

Example 1 was subjected to an annealing treatment after the removal of the SMT layer. The comparative example was subjected to an annealing treatment without removal of the SMT layer. The dopant concentration, here boron, was measured subsequent to the annealing treatment. The dopant concentration in the channel region (11B in Si) of the comparative example is reduced by comparison to Example 1. Further, the instant disclosure provides for a method in which the dopant concentration of the entire active region, i.e., also in the source/drain region, is maintained.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

What is claimed is:

1. A method of fabricating a semiconductor structure, comprising:
   providing a semiconductor substrate;
   forming a gate structure on the semiconductor substrate by forming a polycrystalline gate material in direct contact with the semiconductor substrate;
   forming a source-drain implant region adjacent to the gate structure and in direct contact with both the polycrystalline gate material and the semiconductor substrate;
   forming a compressive stress-transmitting dielectric layer on the source-drain implant region and the gate structure and permanently deforming an underlying channel region located between the source and drain regions and below the polycrystalline gate material by elongating the channel region perpendicular to the semiconductor substrate;
   removing the stress-transmitting dielectric layer; and
   performing an annealing step after the removing of the stress-transmitting dielectric layer.

2. The method of claim 1, further comprising transferring a uniaxial compressive stress from the stress-transmitting dielectric layer to the gate structure.

3. The method of claim 2, wherein the uniaxial compressive stress in the gate structure is of from about 300 MPa to about 3 GPa.

4. The method of claim 1, wherein annealing step is effected at a temperature of from about 950° C. to about 1,200° C.

5. The method of claim 1, wherein the stress-transmitting dielectric layer is a refractory metal nitride.

6. The method of claim 5, wherein the refractory metal nitride is selected from the group consisting of TaN, TiN, WN, MoN, NbN, ReN, and a combination thereof.

7. The method of claim 6, wherein the refractory metal nitride is TiN.

8. The method of claim 1, further comprising applying a capping layer on the source-drain implant region prior to the forming of the stress-transmitting dielectric layer.

9. The method of claim 1, wherein the stress-transmitting dielectric layer is a silicon oxide.

10. The method of claim 1, wherein the stress-transmitting dielectric layer exerts a pressure of from about 300 MPa to about 3 GPa.

11. The method according to claim 1, wherein the semiconductor structure is a n-type metal-oxide-semiconductor (NMOS).

12. The method according to claim 1, wherein the semiconductor structure is a p-type metal-oxide-semiconductor (PMOS).

13. The method according to claim 1, wherein both the source region and the drain region are doped.

14. The method according to claim 1, wherein the method further comprises forming a gate spacer adjacent to and in direct contact with the polycrystalline gate material.

15. The method according to claim 14, wherein the method further comprises forming an extension spacer adjacent to and in direct contact with the gate spacer.

16. The method according to claim 15, wherein the gate spacer comprises a nitride layer on a liner oxide layer.

* * * * *